(12) United States Patent
Takata

(10) Patent No.: US 11,811,393 B2
(45) Date of Patent: Nov. 7, 2023

(54) MULTIPLEXER, RADIO FREQUENCY FRONT-END CIRCUIT, AND COMMUNICATION DEVICE

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 552 days.

(21) Appl. No.: 17/088,640

(22) Filed: Nov. 4, 2020

(65) Prior Publication Data

US 2021/0050845 A1 Feb. 18, 2021

Related U.S. Application Data

(63) Continuation of application No. PCT/JP2019/016578, filed on Apr. 18, 2019.

(30) Foreign Application Priority Data

May 14, 2018 (JP) .................................. 2018-093245

(51) Int. Cl.
 *H04B 1/00* (2006.01)
 *H03H 9/72* (2006.01)
 (Continued)

(52) U.S. Cl.
 CPC ................. *H03H 9/72* (2013.01); *H03F 3/19* (2013.01); *H03H 9/02559* (2013.01);
 (Continued)

(58) Field of Classification Search
 CPC .. H03H 9/72; H03H 9/02559; H03H 9/02866; H03H 9/145; H03H 9/25;
 (Continued)

(56) References Cited

U.S. PATENT DOCUMENTS

| 2008/0150652 A1* | 6/2008 | Itou | H03H 9/725 |
| | | | 333/133 |
| 2012/0126913 A1* | 5/2012 | Hara | H03H 9/706 |
| | | | 333/133 |

(Continued)

FOREIGN PATENT DOCUMENTS

| JP | 2008-160562 A | 7/2008 |
| JP | 2011-040817 A | 2/2011 |

(Continued)

OTHER PUBLICATIONS

Official Communication issued in International Patent Application No. PCT/JP2019/016578, dated Jul. 9, 2019.

*Primary Examiner* — Ping Y Hsieh
(74) *Attorney, Agent, or Firm* — KEATING & BENNETT, LLP

(57) ABSTRACT

A multiplexer includes a filter on a first path connecting a common terminal and an input/output terminal, and a second filter on a second path connecting the common terminal and a second terminal, the second filter having a passband that overlaps a generation frequency of Rayleigh wave ripples in the filter. The filter includes series arm resonators on the first path and a parallel arm resonator, the series arm resonators and the parallel arm resonator utilize an SH wave as a main mode, and a number of electrode finger pairs of the series arm resonator is fewest among numbers of electrode finger pairs of the series arm resonators.

20 Claims, 7 Drawing Sheets

(51) Int. Cl.
- *H03F 3/19* (2006.01)
- *H03H 9/02* (2006.01)
- *H03H 9/145* (2006.01)
- *H03H 9/25* (2006.01)
- *H03H 9/64* (2006.01)
- *H04B 1/40* (2015.01)

(52) U.S. Cl.
CPC ........ *H03H 9/02866* (2013.01); *H03H 9/145* (2013.01); *H03H 9/25* (2013.01); *H03H 9/6496* (2013.01); *H04B 1/40* (2013.01); *H03F 2200/451* (2013.01)

(58) Field of Classification Search
CPC ............. H03H 9/6496; H03H 9/02574; H03H 9/6483; H03H 9/725; H03H 9/64; H03F 3/19; H03F 2200/451; H03F 2200/111; H03F 2203/7209; H03F 1/56; H03F 3/195; H03F 3/245; H04B 1/40; H04B 1/0057

See application file for complete search history.

(56) References Cited

U.S. PATENT DOCUMENTS

| | | | |
|---|---|---|---|
| 2016/0149554 A1* | 5/2016 | Nakagawa | H03H 9/64 310/357 |
| 2019/0123722 A1* | 4/2019 | Nosaka | H03H 9/6489 |

FOREIGN PATENT DOCUMENTS

| | | |
|---|---|---|
| JP | 2013-081068 A | 5/2013 |
| WO | 2015/033892 A1 | 3/2015 |
| WO | 2017/217197 A1 | 12/2017 |

* cited by examiner

MULTIPLEXER, RADIO FREQUENCY FRONT-END CIRCUIT, AND COMMUNICATION DEVICE

CROSS REFERENCE TO RELATED APPLICATIONS

This application claims the benefit of priority to Japanese Patent Application No. 2018-093245 filed on May 14, 2018 and is a Continuation Application of PCT Application No. PCT/JP2019/016578 filed on Apr. 18, 2019. The entire contents of each application are hereby incorporated herein by reference.

BACKGROUND OF THE INVENTION

1. Field of the Invention

The present invention relates to multiplexers, radio frequency front-end circuits, and communication devices.

2. Description of the Related Art

Recently, in communication devices such as cellular phone terminals and the like, multiplexers (demultiplexers) that separate (demultiplex) a radio frequency signal into different frequency bands are widely used to enable a single terminal to handle a plurality of frequency bands and a plurality of radio systems, that is, to be multiband and multimode compatible.

Japanese Unexamined Patent Application Publication No. 2013-81068 discloses a one-chip leaky surface acoustic wave demultiplexer in which a ladder bandpass filter and a multimode coupled bandpass filter are connected in common. A series arm resonator is arranged on the side closest to the common connection point in the ladder bandpass filter, and the ladder bandpass filter includes a plurality of series arm resonators including this series arm resonator.

In Japanese Unexamined Patent Application Publication No. 2013-81068, there is an issue of Rayleigh wave ripples in each acoustic wave resonator. Rayleigh wave ripples are generated, for example, in the case where a bandpass filter that makes up a demultiplexer utilizes leaky waves as primary acoustic waves, or in the case where the bandpass filter includes a resonator having a multilayer structure (details of which will be described below) consisting of a piezoelectric layer, a high acoustic velocity support substrate, and a low acoustic velocity film, or in other similar cases. That is to say, in the case where a plurality of bandpass filters are connected in common as described above, when Rayleigh wave ripples of an acoustic wave resonator in one of the plurality of bandpass filters are generated in the passband of another bandpass filter, ripples will be generated in the passband of this another bandpass filter, and this poses an issue of degradation of insertion loss in this another bandpass filter.

SUMMARY OF THE INVENTION

Preferred embodiments of the present invention provide multiplexers and the like, which are each capable of reducing or preventing degradation of insertion loss in a passband caused by Rayleigh wave ripples of an acoustic wave resonator.

A multiplexer according to a preferred embodiment of the present invention includes a first filter on a first path connecting a common terminal and a first terminal; and a second filter on a second path connecting the common terminal and a second terminal, the second filter having a passband that overlaps a generation frequency of a Rayleigh wave ripple in the first filter. The first filter includes a plurality of series arm resonators on the first path, and a first parallel arm resonator between a connection node provided on the first path and ground, the connection node being provided on a side closer to the first terminal than a first series arm resonator, the first series arm resonator being one of the plurality of series arm resonators connected closest to the common terminal, the plurality of series arm resonators and the first parallel arm resonator utilize a shear horizontal (SH) wave as a main mode, and a number of electrode finger pairs of the first series arm resonator is fewest among numbers of electrode finger pairs of the plurality of series arm resonators.

A radio frequency front-end circuit according to a preferred embodiment of the present invention includes a multiplexer according to a preferred embodiment of the present invention and an amplifier circuit connected to the multiplexer.

A communication device according to a preferred embodiment of the present invention includes a RF signal processing circuit that processes a radio frequency signal received by or to be transmitted from an antenna element and the radio frequency front-end circuit that sends a radio frequency signal between the antenna element and the RF signal processing circuit.

The multiplexers or the like according to preferred embodiments of the present invention are each capable of reducing or preventing degradation of insertion loss in a passband caused by Rayleigh wave ripples of an acoustic wave resonator.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
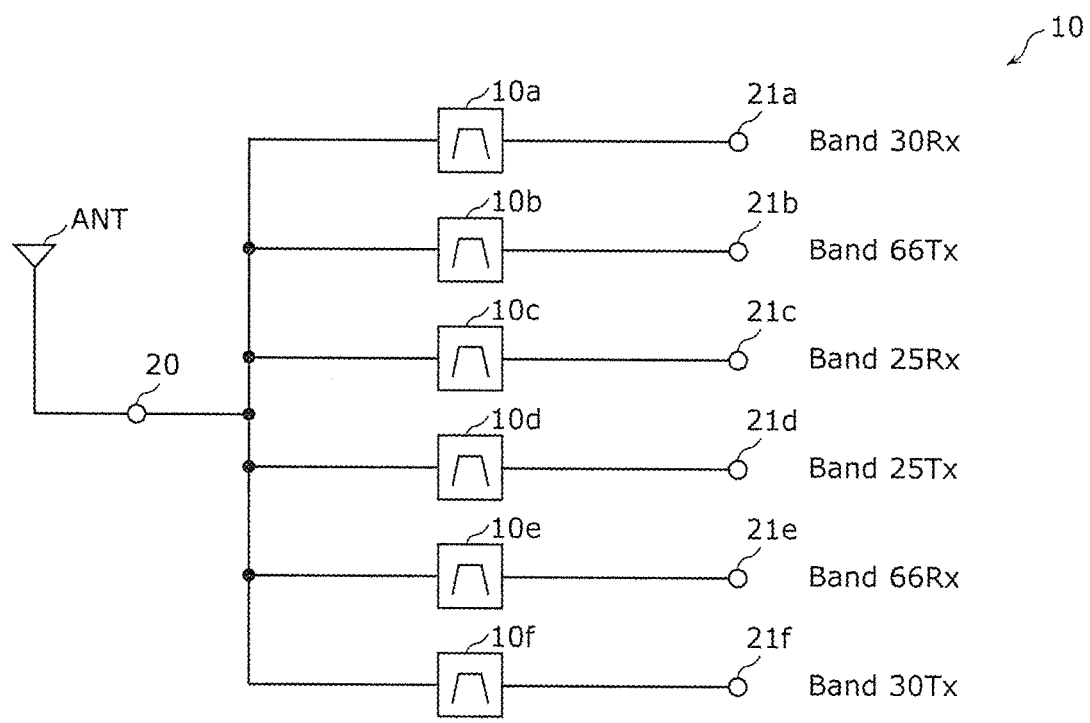
FIG. 1 is a configuration diagram illustrating one example of a multiplexer according to a preferred embodiment 1 of the present invention.

Hereinafter, preferred embodiments of the present invention will be described in detail with reference to the drawings. Note that the preferred embodiments, which will be described below, each illustrate a comprehensive or specific example. Numeric values, shapes, materials, elements, arrangements and connection configurations of the elements, and the like illustrated in the following preferred embodiments are mere examples, and not intended to limit the present invention. Of elements in the following preferred embodiments, the elements that are not described in independent claims will be described as optional elements. Further, dimensions or ratios of dimensions of elements illustrated in the drawings are not necessarily precise. Further, in the drawings, the same reference characters denote the same or substantially the same elements, and in some cases an overlapping description is omitted or simplified. Further, in the following preferred embodiments, the term "connect" includes not only the case of direct connection, but also the case where an electrical connection is established with another element or the like interposed therebetween.

Preferred Embodiment 1

1. Configuration of Multiplexer

FIG. 1 is a configuration diagram illustrating one example of a multiplexer 10 according to a preferred embodiment 1 of the present invention. FIG. 1 illustrates an antenna element ANT connected to a common terminal 20 of the multiplexer 10. The antenna element ANT is a multiband antenna in compliance with communication standards such as, for example, Long Term Evolution (LTE) and the like for transmitting and receiving radio frequency signals.

The multiplexer 10 is a demultiplexer/multiplexer circuit that uses an acoustic wave filter and is, for example, a hexaplexer in the present preferred embodiment. The multiplexer 10 includes, as input/output terminals, a common terminal 20, an input/output terminal 21a (first terminal), an input/output terminal 21b (second terminal), an input/output terminal 21c, an input/output terminal 21d, an input/output terminal 21e, and an input/output terminal 21f. The multiplexer 10 includes filters 10a to 10f, and one side of each filter (the side other than the side connected to the foregoing input/output terminal 21a, . . . , 21f) is connected in common to the common terminal 20.

The common terminal 20 is provided in common for six filters 10a to 10f and is connected to the filters 10a to 10f within the multiplexer 10. Further, the common terminal 20 is connected to the antenna element ANT outside the multiplexer 10. That is to say, the common terminal 20 is also an antenna terminal of the multiplexer 10.

The input/output terminals 21a to 21f are respectively provided for six filters 10a to 10f in this order and are connected to the corresponding filters within the multiplexer 10. Further, the input/output terminals 21a to 21f are connected to a RF signal processing circuit (RFIC: Radio Frequency Integrated Circuit, which is not illustrated) outside the multiplexer 10 via an amplifier circuit or the like (not illustrated in FIG. 1).

The filter 10a is a first filter on a first path connecting the common terminal 20 and the input/output terminal 21a. The filter 10a is a reception filter that utilizes an acoustic wave, and in this example, a passband of the filter 10a is preferably, for example, LTE Band 30 Rx (about 2350 MHz-about 2360 MHz).

The filter 10b is a second filter on a second path connecting the common terminal 20 and the input/output terminal 21b. The filter 10b is a transmission filter that utilizes an acoustic wave, and in this example, a passband of the filter 10b is preferably, for example, LTE Band 66 Tx (about 1710 MHz-about 1780 MHz).

The filter 10c is on a path connecting the common terminal 20 and the input/output terminal 21c. The filter 10c is a reception filter that utilizes an acoustic wave, and in this example, a passband of the filter 10c is preferably, for example, LTE Band 25 Rx (about 1930 MHz-about 1995 MHz).

The filter 10d is on a path connecting the common terminal 20 and the input/output terminal 21d. The filter 10d is a transmission filter that utilizes an acoustic wave, and in this example, a passband of the filter 10d is preferably, for example, LTE Band 25 Tx (about 1850 MHz-about 1915 MHz).

The filter 10e is on a path connecting the common terminal 20 and the input/output terminal 21e. The filter 10e is a reception filter that utilizes an acoustic wave, and in this example, a passband of the filter 10e is preferably, for example, LTE Band 66 Rx (about 2110 MHz-about 2200 MHz).

The filter 10f is on a path connecting the common terminal 20 and the input/output terminal 21f. The filter 10f is a transmission filter that utilizes an acoustic wave, and in this example, a passband of the filter 10f is preferably, for example, LTE Band 30 Tx (about 2305 MHz-about 2315 MHz).

As described above, the passbands of the filters are, for example, different from each other, and the single multiplexer 10 can handle a plurality of frequency bands.

Note that the passbands of the six filters 10a to 10f are not limited to a combination of Band 30, Band 66, and Band 25. Further, the number of the filters connected to the common terminal 20 may be two or more. Further, the multiplexer 10 may include only a plurality of transmission filters or only a plurality of reception filters.

2. Configuration of Filter

Next, the configuration of the first filter (filter 10a) according to the preferred embodiment 1 is described. Note that hereinafter the preferred embodiment 1 is referred to as a working example.

Figure 2:
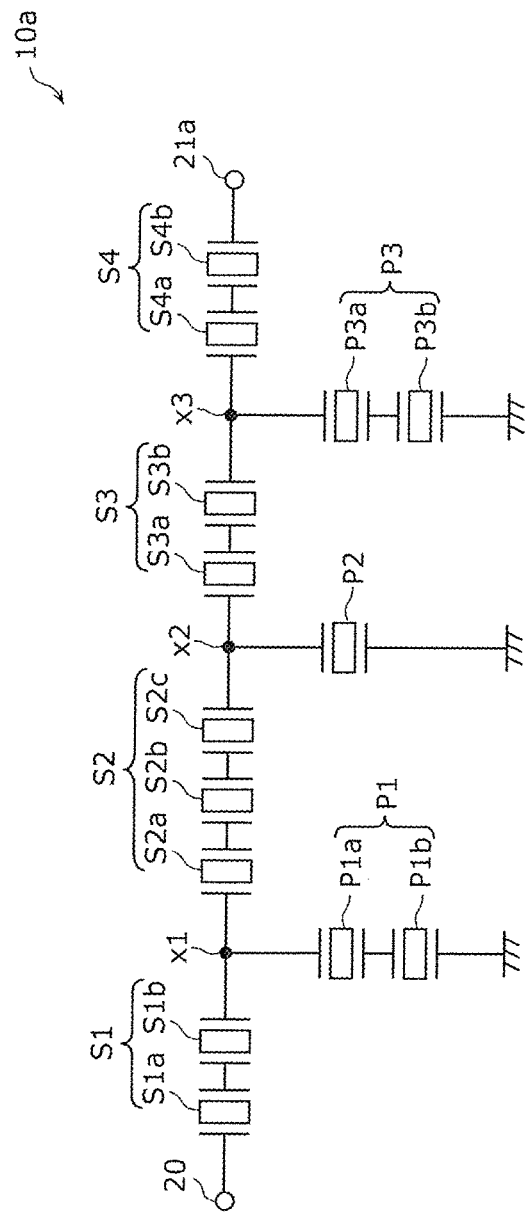
FIG. 2 is a circuit configuration diagram illustrating one example of a first filter according to a working example of a preferred embodiment of the present invention.

FIG. 2 is a circuit configuration diagram illustrating one example of the first filter (filter 10a) according to the working example.

The filter 10a includes a plurality of series arm resonators on a first path connecting the common terminal 20 and the input/output terminal 21a and a first parallel arm resonator between a connection node provided on the first path and ground, the connection node being provided on the side closer to the input/output terminal 21a than a first series arm resonator which is one of the plurality of series arm resonators connected closest to the common terminal 20. The connection node is a connection point between an element and an element or between an element and a terminal, and is illustrated as a point denoted by x1 and the like in FIG. 2.

In the preferred embodiment 1, the plurality of series arm resonators includes at least three series arm resonators. The filter 10a includes, as at least three series arm resonators, series arm resonators S1 to S4 that are connected to each other in series. The series arm resonator S1 is the first series arm resonator that is the one of series arm resonators S1 to S4 connected closest to the common terminal 20. Further, the filter 10a includes a plurality of parallel arm resonators that includes the first parallel arm resonator. The filter 10a includes, as the plurality of parallel arm resonators, a parallel arm resonator P1 connected between a connection node x1 between the series arm resonators S1 and S2 and the ground, a parallel arm resonator P2 connected between a connection node x2 between the series arm resonators S2 and S3 and the ground, and a parallel arm resonator P3 connected between a connection node x3 between the series arm resonators S3 and S4 and the ground. The plurality of parallel arm resonators are disposed between the ground and the connection nodes x1 to x3, which are provided on the side closer to the input/output terminal 21a than the series arm resonator S1, and this means that the arrangement of the plurality of parallel arm resonators starts from the series arm resonator S1 when the filter 10a is viewed from the common terminal 20 side. In other words, it means that no parallel arm resonator is connected between the common terminal 20 and the series arm resonator S1.

The parallel arm resonator P1 is the first parallel arm resonator that is the one of the plurality of parallel arm resonators (parallel arm resonators P1 to P3) connected closest to the common terminal 20.

The series arm resonators S1 to S4 and the parallel arm resonators P1 to P3 define the passband of the filter 10a. Specifically, it is designed such that the resonant frequencies of the series arm resonators S1 to S4 and the anti-resonant frequencies of the parallel arm resonators P1 to P3 are near the center frequency of the passband of the filter 10a. Further, it is designed such that the anti-resonant frequencies of the series arm resonators S1 to S4 are located at attenuation poles near the high frequency side of this passband and such that the resonant frequencies of the parallel arm resonators P1 to P3 are located near the low frequency side of this passband. In this way, the passband is defined.

Further, in the preferred embodiment 1, the series arm resonators S1 to S4 and the parallel arm resonators P1 and P3 each include a plurality of divided resonators, which are provided by dividing a single resonator. The series arm resonator S1 includes divided resonators S1a and S1b, the series arm resonator S2 includes divided resonators S2a to S2c, the series arm resonator S3 includes divided resonators S3a and S3b, and the series arm resonator S4 includes divided resonators S4a and S4b. The parallel arm resonator P1 includes divided resonators P1a and P1b, and the parallel arm resonator P3 includes divided resonators P3a and P3b. Inter Modulation Distortion (IMD) characteristics can be improved by providing a single resonator including a plurality of divided resonators as described above, although a detailed description thereof is not provided here.

The plurality of series arm resonators and the first parallel arm resonator utilize SH waves such as leaky waves or the like as the main mode. In other words, the plurality of series arm resonators and the first parallel arm resonator each include an interdigital transducer (IDT) electrode that excites an acoustic wave whose main component is SH waves. For example, a plurality of divided resonators for a single resonator are evenly divided, and when focused on the number of pairs of a plurality of electrode fingers of the IDT electrode (number of electrode finger pairs), the numbers of pairs of the plurality of divided resonators for a single resonator are the same to each other. Note that hereinafter the number of pairs of a plurality of electrode fingers of the IDT electrode of a resonator is also referred to as the number of pairs of a resonator.

The IDT electrode of each of the plurality of series arm resonators and the first parallel arm resonator is provided on a substrate including a piezoelectric layer (substrate having piezoelectricity), and the substrate includes the piezoelectric layer, on one of principal surfaces on which the IDT electrode is provided, a high acoustic velocity support substrate in which the acoustic velocity of bulk waves propagating therein is higher than the acoustic velocity of acoustic waves propagating in the piezoelectric layer, and a low acoustic velocity film in which the acoustic velocity of bulk waves propagating therein is lower than the acoustic velocity of bulk waves propagating in the piezoelectric layer, the low acoustic velocity film being disposed between the high acoustic velocity support substrate and the piezoelectric layer. Details are provided with reference to FIG. 3, which will be described below. Because each resonator of the filter 10a has such a multilayer structure, Rayleigh wave ripples generated in the filter 10a become larger.

3. Basic Structure of Resonator

Next, the basic structure of each of the resonators of the filter 10a (series arm resonators, parallel arm resonators, and divided resonators of the resonators) is described. In the present preferred embodiment, the resonator is preferably a surface acoustic wave (SAW) resonator, for example.

Figure 3:
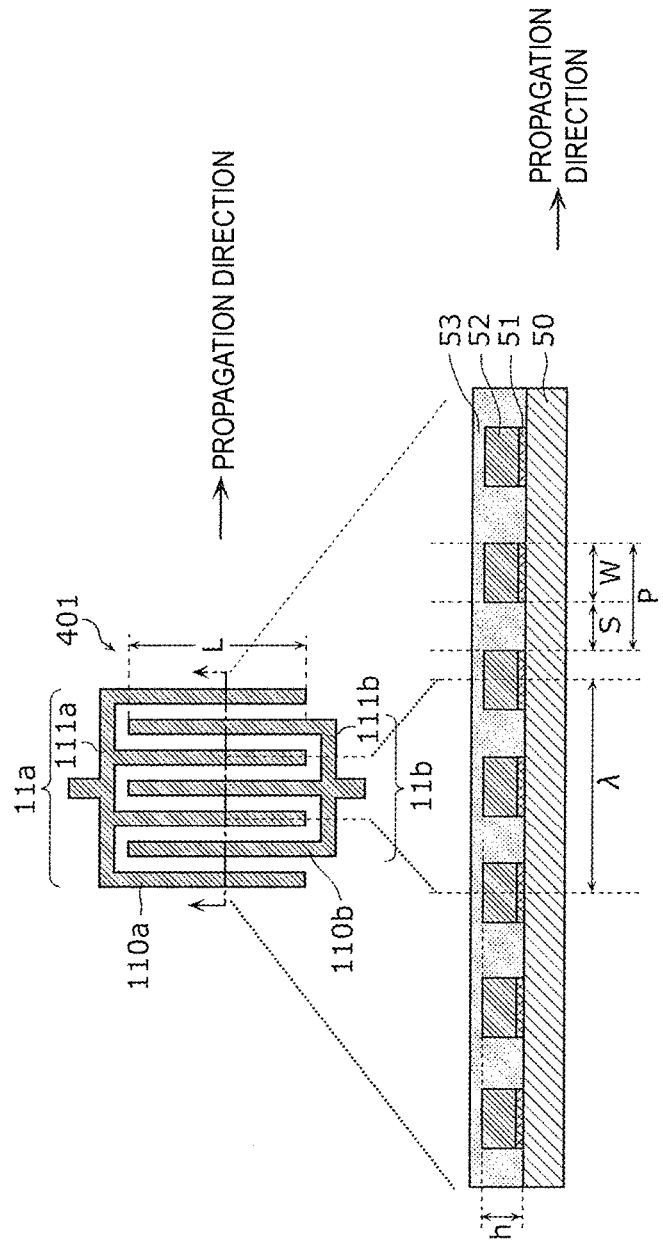
FIG. 3 is a plan view and a sectional view schematically illustrating a resonator of the first filter according to the preferred embodiment 1 of the present invention.

FIG. 3 is a plan view and a sectional view schematically illustrating a resonator of a first filter (filter 10a) according to the preferred embodiment 1. FIG. 3 illustrates an exemplary schematic plan view and an exemplary schematic sectional view showing the structure of a resonator 401 as one example of a plurality of resonators of the filter 10a. Note that the resonator 401 illustrated in FIG. 3 is provided for illustration of a typical structure of the plurality of resonators, and the number of electrode fingers of the electrode and the length of the electrode finger are not limited thereto.

As illustrated in the plan view of FIG. 3, the resonator 401 includes a pair of comb-shaped electrodes 11a and 11b, which are opposite each other. Although it is not illustrated, the resonator 401 further includes a reflector adjacent to the pair of comb-shaped electrodes 11a and 11b in a propagation direction of acoustic waves. The pair of comb-shaped electrodes 11a and 11b define the IDT electrode.

The comb-shaped electrode 11a includes a plurality of electrode fingers 110a parallel or substantially parallel to each other, which are arranged in a comb shape, and a busbar electrode 111a that connect one-end portions of respective ones of the plurality of electrode fingers 110a. Further, the comb-shaped electrode 11b includes a plurality of electrode fingers 110b parallel or substantially parallel to each other, which are arranged in a comb shape, and a busbar electrode 111b that connect one-end portions of respective ones of the plurality of electrode fingers 110b. The plurality of electrode fingers 110a and the plurality of electrode fingers 110b extend in an orthogonal or substantially orthogonal direction of the propagation direction of acoustic waves.

Note that the comb-shaped electrodes 11a and 11b are not limited to the foregoing configurations and may include, for example, offset electrode fingers. Further, the resonator 401 may include an inclined IDT in which the busbar electrodes 111a and 111b are inclined with respect to the propagation direction of acoustic waves. Further, the resonator 401 may include a thinned electrode in which the electrode fingers 110a and 110b are thinned out at preset intervals.

Further, the IDT electrode includes the plurality of electrode fingers 110a, the plurality of electrode fingers 110b, and the busbar electrodes 111a and 111b and has a multilayer structure including an adhesion layer 51 and a primary electrode layer 52 as illustrated in the sectional view of FIG. 3.

The adhesion layer 51 is provided to improve adhesiveness between a piezoelectric substrate 50 and the primary electrode layer 52, and for example, Ti is preferably used as a material thereof. The film thickness of the adhesion layer 51 is preferably, for example, about 12 nm.

For the primary electrode layer 52, as a material, for example, Al containing about 1% of Cu is preferably used. The film thickness of the primary electrode layer 52 is preferably, for example, about 162 nm.

A protective layer 53 covers the IDT electrode. The protective layer 53 is provided to protect the primary electrode layer 52 from external environments, adjust frequency-temperature characteristics, and improve moisture resistance, and is, for example, a film whose main component is preferably silicon dioxide. The film thickness of the protective layer 53 is preferably, for example, about 25 nm.

Note that the materials used for the adhesion layer 51, the primary electrode layer 52, and the protective layer 53 are not limited to the materials described above. Further, the IDT electrode may not need to have the foregoing multilayer structure. For example, the IDT electrode may preferably be made of a metal such as Ti, Al, Cu, Pt, Au, Ag, Pd, or the like, or an alloy thereof, or may include a plurality of multilayer bodies each being made of the foregoing metal or alloy. Further, the protective layer 53 may not need to be provided.

The piezoelectric substrate 50 has piezoelectricity, and on a principal surface thereof the IDT electrode and the reflectors are provided. For example, the piezoelectric substrate 50 is preferably made of 42° Y-cut X-propagation LiTaO$_3$ piezoelectric single crystal or piezoelectric ceramics (lithium tantalate single crystal or ceramics that is cut at a surface whose normal is equal to an axis obtained by rotating from the Y axis by about 42° about the X axis that defines and functions as the center axis, and in this single crystal or ceramics a surface acoustic wave propagates in the X axis direction).

The piezoelectric substrate 50 has a multilayer structure in which a high acoustic velocity support substrate, a low acoustic velocity film, and a piezoelectric film (piezoelectric layer) are stacked on top of each other in this order. The piezoelectric film is preferably, for example, made of 42° Y-cut X-propagation LiTaO$_3$ piezoelectric single crystal or piezoelectric ceramics. The thickness of the piezoelectric film is preferably, for example, about 600 nm, for example. The high acoustic velocity support substrate supports the low acoustic velocity film, the piezoelectric film, and the IDT electrode. Further, the high acoustic velocity support substrate is a substrate in which the acoustic velocity of bulk waves in the high acoustic velocity support substrate is higher than the acoustic velocity of acoustic waves of surface waves or boundary waves propagating in the piezoelectric film, and functions to confine surface acoustic waves within a portion where the piezoelectric film and the low acoustic velocity film are stacked on top of each other and prevent the surface acoustic waves from leaking from the high acoustic velocity support substrate downward. The high acoustic velocity support substrate is preferably, for example, a silicon substrate and preferably has a thickness of, for example, about 200 μm. The low acoustic velocity film is a film in which the acoustic velocity of bulk waves in the low acoustic velocity film is lower than the acoustic velocity of bulk waves propagating in the piezoelectric film and is disposed between the piezoelectric film and the high acoustic velocity support substrate. According to this structure and the property that energy is focused in a medium where the acoustic velocity of acoustic waves is inherently low, the leakage of surface acoustic wave energy to outside the IDT electrode is reduced or prevented. The low acoustic velocity film is preferably, for example, a film whose main component is silicon dioxide and has a thickness of, for example, about 670 nm. Note that a joining layer made of Ti, Ni, or the like, for example, may be included in the low acoustic velocity film. The low acoustic velocity film may have a multilayer structure made of a plurality of low acoustic velocity materials, for example. This multilayer structure enables Q-factors in the resonant frequency and the anti-resonant frequency to be substantially increased compared with a structure in which a single layer of the piezoelectric substrate 50 is used. That is to say, because a high Q-factor surface acoustic wave resonator can be provided, it becomes possible to provide a filter having a low insertion loss using the surface acoustic wave resonator.

Note that the high acoustic velocity support substrate may have a structure in which a support substrate and a high acoustic velocity film, in which the acoustic velocity of propagating bulk waves is higher than the acoustic velocity of acoustic waves of boundary waves or surface waves propagating in the piezoelectric film, are stacked on top of each other. In this case, for the support substrate, for example, a piezoelectric body such as lithium tantalate, lithium niobate, crystal, or the like, or various ceramics such as sapphire, alumina, magnesia, silicon nitride, aluminum nitride, silicon carbide, zirconia, cordierite, mullite, steatite, forsterite, or the like, or a dielectric such as glass or the like, or a semiconductor such as silicon, gallium nitride, or the like, or a resin substrate or the like can be used. Further, for the high acoustic velocity film, various high acoustic velocity materials such as aluminum nitride, aluminum oxide, silicon carbide, silicon nitride, silicon oxynitride, a DLC film, or diamond, or a medium whose main component is one of the foregoing materials, or a medium whose main component is a mixture of the foregoing materials, or the like can preferably be used.

Here, electrode parameters of the IDT electrode of the surface acoustic wave resonator are described.

The wavelength of the surface acoustic wave resonator is defined by a wavelength λ, which is a repetition period of the plurality of electrode fingers 110a or the plurality of electrode fingers 110b of the IDT electrode illustrated in FIG. 3. Further, an electrode pitch P is about ½ of the wavelength λ and is defined as (W+S), where W is the line width of the electrode fingers 110a and 110b that respectively make up the comb-shaped electrodes 11a and 11b, and S is the space width between the electrode finger 110a and the electrode finger 110b, which are adjacent to each other. Further, the intersecting width L of a pair of the comb-shaped electrodes 11a and 11b is the overlapping length of the electrode fingers when viewed from the propagation direction. Further, the electrode duty R of each resonator is a line width occupancy of the plurality of electrode fingers 110a and the plurality of electrode fingers 110b, or a ratio of the line width of the plurality of electrode fingers 110a and the plurality of electrode fingers 110b to a sum value of the line width and the space width of the plurality of electrode fingers 110a and the plurality of electrode fingers 110b, and is defined by W/(W+S). Further, the number of pairs is the number of pair-forming electrode fingers 110a and electrode fingers 110b of the comb-shaped electrodes 11a and 11b and is approximately one-half of the total numbers of the electrode fingers 110a and the electrode fingers 110b. For example, in the case where the number of pairs is N and the total number of the electrode fingers 110a and the electrode fingers 110b is M, M=(N+1)×2 is satisfied. That is to say, the number of areas provided between a top-end portion of one electrode finger of one of the comb-shaped electrodes 11a and 11b and the busbar electrode of the other comb-shaped electrode opposite this top-end portion corresponds to 0.5 pairs. Further, the film thickness of the IDT electrode is the thickness h of the plurality of electrode fingers 110a and the plurality of electrode fingers 110b.

4. Effects of Rayleigh Wave Ripples

Here, effects of the Rayleigh wave ripples generated in the filter 10a are described. The generation frequency of Rayleigh wave ripples in the filter 10a is a frequency of about 0.76 times the passband of the filter 10a. Specifically, because there is a ±0.02-fold variation as processing variations of the filter 10a, the generation frequency of Rayleigh wave ripples in the filter 10a is a frequency of about 0.74 to about 0.78 times the passband of the filter 10a. Of the filters 10b to 10f connected in common to the common terminal 20 together with the filter 10a, the filter 10b has a passband that overlaps the generation frequency of Rayleigh wave ripples in the filter 10a.

Figure 4:
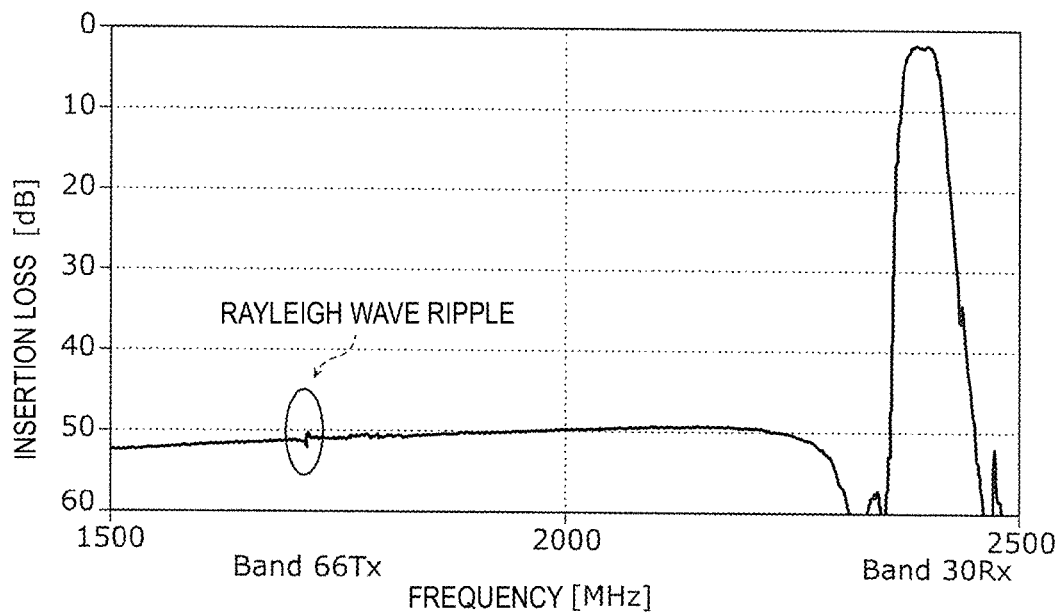
FIG. 4 is a diagram for illustrating Rayleigh wave ripples.

FIG. 4 is a diagram for illustrating Rayleigh wave ripples. In FIG. 4, the horizontal axis represents the frequency, and the vertical axis represents the insertion loss of the filter 10a. As described above, because each resonator of the filter 10a has the multilayer structure including the piezoelectric layer, the high acoustic velocity support substrate, and the low acoustic velocity film, Rayleigh wave ripples generated in the filter 10a become greater. As illustrated in FIG. 4, it was discovered that Rayleigh wave ripples are generated in Band 66 Tx, which overlaps with a frequency of about 0.76 times Band 30 Rx that is the passband of the filter 10a, namely, the passband of the filter 10b. At the frequency where the Rayleigh wave ripples are generated, the reflection coefficient degrades (decreases) when the filter 10a is viewed from the common terminal 20. In other words, the return loss increases. Because the frequency at which the Rayleigh wave ripples are generated is included in the passband of the filter 10b, ripples caused by the Rayleigh wave ripples are generated in the passband of the filter 10b. These ripples generated in the passband causes degradation of insertion loss in the passband of the filter 10b.

As a result of careful examination, the inventor of preferred embodiments of the present invention discovered that a cause of degradation of insertion loss of the filter 10b (Band 66 Tx filter) is the Rayleigh wave ripples described above and that the degradation of insertion loss of the filter 10b can be reduced or prevented by applying configurations (resonator parameters) such as illustrated below to the filter 10a.

5. Comparison Between Working Example and Comparative Example

Table 1 illustrates the resonator parameters of each resonator of the filter 10a according to a working example of a preferred embodiment of the present invention. Table 2 illustrates the resonator parameters of each resonator of the filter 10a according to a comparative example. Note that the circuit configuration of the filter according to the comparative example is the same or substantially the same as that of the filter according to the working example. Therefore, the same reference character 10a is used and the description thereof is omitted. The working example is different from the comparative example in the numbers of pairs and the intersecting widths of the series arm resonators that make up the filter 10a.

In the preferred embodiment 1, the series arm resonators S1 to S4 and the parallel arm resonators P1 and P3 each include a plurality of divided resonators, which are provided by dividing a single resonator. For the resonators including divided resonators, the numbers of pairs illustrated in Table 1 and Table 2 are the numbers of pairs of the divided resonators. For example, the series arm resonator S1 includes the divided resonators S1a and S1b, and the number of pairs of each of the divided resonators S1a and S1b is 75 pairs.

TABLE 1

| Working Example | S1 | S2 | S3 | S4 | P1 | P2 | P3 |
|---|---|---|---|---|---|---|---|
| Number of Pairs (pairs) | 75 | 100 | 150 | 160 | 70 | 250 | 110 |
| Intersecting Width (μm) | 32.1 | 17.9 | 15.0 | 12.4 | 32.8 | 87.3 | 16.6 |
| Wavelength (μm) | 1.603 | 1.625 | 1.612 | 1.635 | 1.652 | 1.694 | 1.655 |

TABLE 2

| Comparative example | S1 | S2 | S3 | S4 | P1 | P2 | P3 |
|---|---|---|---|---|---|---|---|
| Number of Pairs (pairs) | 140 | 100 | 90 | 85 | 70 | 250 | 110 |
| Intersecting Width (μm) | 17.2 | 17.9 | 25.0 | 23.3 | 32.8 | 87.3 | 16.6 |
| Wavelength (μm) | 1.603 | 1.625 | 1.612 | 1.635 | 1.652 | 1.694 | 1.655 |

As illustrated in Table 1 and Table 2, in the working example, the number of pairs of a plurality of electrode fingers of the IDT electrode of the series arm resonator S1 (the number of electrode finger pairs of the series arm resonator S1) is the fewest among the numbers of pairs of pluralities of electrode fingers of the IDT electrodes of the respective series arm resonators S1 to S4 (the numbers of electrode finger pairs of the respective series arm resonators S1 to S4). Further, with regard to the numbers of pairs of the series arm resonators S1 to S4, the closer the series arm resonator is to the common terminal 20, the fewer the number of pairs becomes. On the other hand, in the comparative example, the number of pairs of the series arm resonator S1 is the largest among the numbers of pairs of the respective series arm resonators S1 to S4. Further, in both the working example and the comparative example, the number of pairs of the parallel arm resonator P1 is the fewest among the numbers of pairs of the respective parallel arm resonators P1 to P3.

Figure 5:
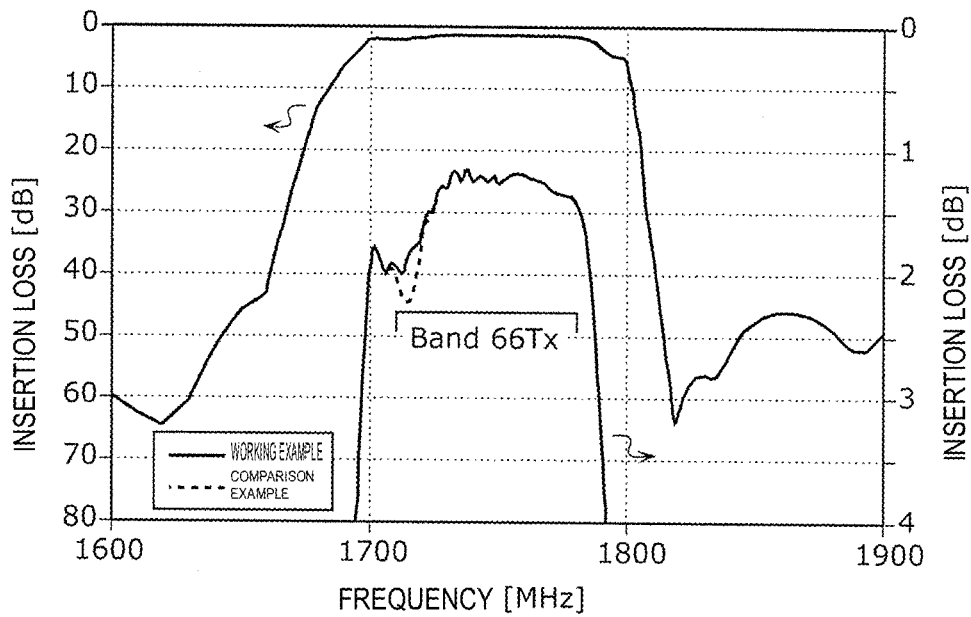
FIG. 5 is a graph that compares bandpass characteristics of second filters according to a working example of a preferred embodiment of the present invention and a comparative example.

FIG. 5 is a graph that compares bandpass characteristics of the filters 10b (second filters) according to the working example and the comparative example. In FIG. 5, the horizontal axis represents the frequency, and the vertical axis represents the insertion loss of the filter 10b. In FIG. 5, the characteristic in the working example is denoted by solid line, and the characteristic in the comparative example is denoted by dashed line. The same applies to FIG. 6 and FIG. 8, which will be described below.

As illustrated in FIG. 5, it is discovered that in the passband of the filter 10b (that is, Band 66 Tx), the insertion loss in the passband is improved in the working example compared with the comparative example. Specifically, the insertion loss in the passband of the comparative example is about 2.22 dB at a maximum, whereas the insertion loss in the passband of the working example is about 1.98 dB at a maximum. This is because Rayleigh wave ripples generated in the filter 10a are smaller in the working example compared with the comparative example. This is further described using FIG. 6 and FIG. 7.

Figure 6:
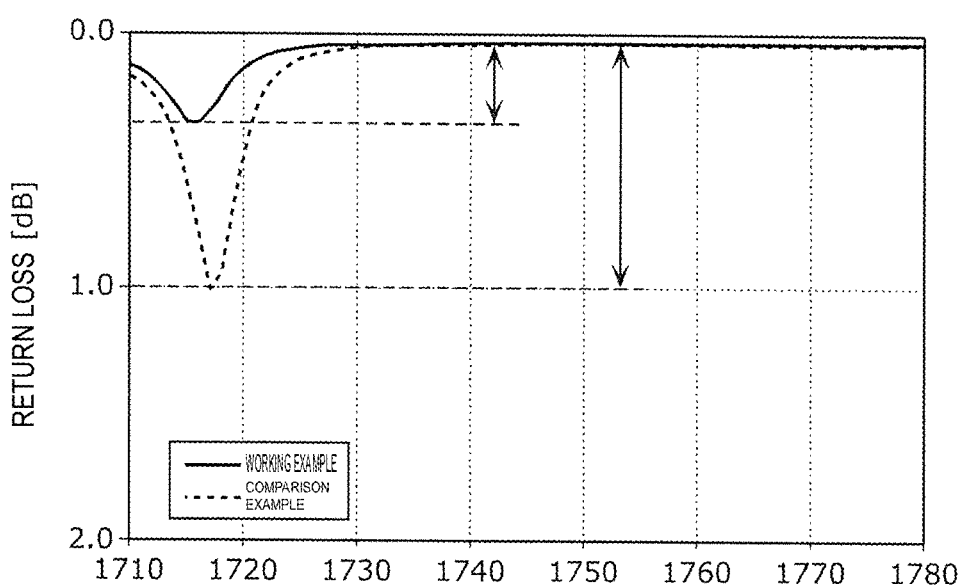
FIG. 6 is a graph that compares return loss characteristics of the first filters according to the working example and the comparative example, which are viewed from the common terminal side.

FIG. 6 is a graph that compares return loss characteristics of the filters 10a (first filters) according to the working example and the comparative example, which are viewed from the common terminal 20 side. In FIG. 6, the horizontal axis represents the frequency, and the vertical axis represents the return loss of the filter 10a.

When the return loss of the filter 10a (first filter) becomes greater, a signal component leaking from the filter 10b (second filter) to the passband of the filter 10a (that is, Band 30 Rx) increases, and therefore the insertion loss in the passband of the filter 10b (that is, Band 66 Tx) degrades. In the filter 10a, the series arm resonator S1, which is the series arm resonator connected closest to the common terminal 20 among the series arm resonators S1 to S4, is likely to affect the filter 10a and the filter 10b connected in common to the common terminal 20. Accordingly, it is conceivable that the filter 10b is affected by the resonator parameters of the series arm resonator S1 connected closest to the common terminal 20 side in the filter 10a. In view of this, of the resonator parameters, preferred embodiments of the present invention focus on the number of pairs of a resonator.

In the working example, of the numbers of pairs of the series arm resonators S1 to S4, the number of pairs of the series arm resonator S1 is the fewest, whereas in the comparative example, of the numbers of pairs of the series arm resonators S1 to S4, the number of pairs of the series arm resonator S1 is the largest. As illustrated in FIG. 6, it is found that in Band 66 Tx (1710-1780 MHz), a return loss difference (difference between the maximum and the minimum of the return loss in Band 30 Rx) is smaller in the working example in which the number of pairs of the series arm resonator S1 is fewer, whereas the return loss difference is larger in the comparative example in which the number of pairs of the series arm resonator S1 is larger.

Figure 7:
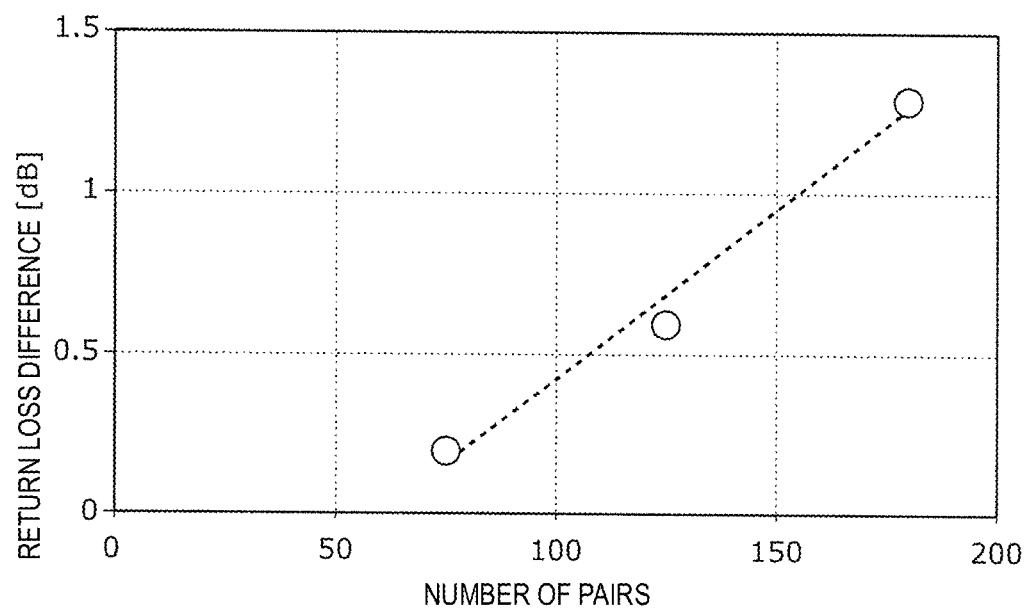
FIG. 7 is a graph illustrating a relationship between the number of pairs of a first series arm resonator according to the preferred embodiment 1 and a return loss difference.

FIG. 7 is a graph illustrating a relationship between the number of pairs of the series arm resonator S1 (first series arm resonator) according to the preferred embodiment 1 and the return loss difference. In FIG. 7, the horizontal axis represents the number of pairs of the series arm resonator S1, and the vertical axis represents the return loss difference of the filter 10a. It was discovered, also seen in FIG. 7, that the return loss difference decreases as the number of pairs of the series arm resonator S1 becomes less.

As described above, in the frequency in which Rayleigh wave ripples are generated in the filter 10a, the return loss of the filter 10a increases. Accordingly, from the results illustrated in FIG. 6 and FIG. 7, Rayleigh wave ripples are reduced or prevented in the working example where the return loss difference is smaller. That is to say, Rayleigh wave ripples can be reduced or prevented by reducing the number of pairs of the series arm resonator S1 as with the working example. Accordingly, as illustrated in FIG. 5, the degradation of insertion loss in the passband of the filter 10b caused by Rayleigh wave ripples is being reduced or prevented in the working example compared with the comparative example. The return loss difference becomes smaller as the number of pairs of a resonator decreases. This is considered to be effects of the degradation of reflection efficiency (confinement efficiency) in the IDT electrode as the number of pairs of a resonator decreases.

Further, with regard to the numbers of pairs of the series arm resonators S1 to S4, the closer the series arm resonator is to the common terminal 20, the fewer the number of pairs becomes. This is because the series arm resonator connected closer to the common terminal 20 side is more likely to affect the return loss of the filter 10b.

Similarly, of the parallel arm resonators P1 to P3, the parallel arm resonator P1 connected closest to the common terminal 20 is likely to affect the return loss of the filter 10a because the parallel arm resonator P1 is connected to the common terminal 20 side as is the case with the series arm resonator S1. Therefore, in the working example, of the numbers of pairs of the parallel arm resonators P1 to P3, the number of pairs of the parallel arm resonator P1 is the fewest, and therefore the degradation of insertion loss in the passband of the filter 10b caused by Rayleigh wave ripples can be reduced or prevented more efficiently.

Further, as described above, the series arm resonator S1 is likely to affect the return loss of the filter 10a. However, the series arm resonators S2 to S4, which are spaced away from the common terminal 20, are less likely to affect the return loss of the filter 10a even when the numbers of pairs are increased. Because of this, as illustrated in Table 1, in the working example, the number of pairs of each of the series arm resonators S2 to S4, not including the series arm resonator S1, is larger than the number of pairs of the series arm resonator S1. On the other hand, as illustrated in Table 2, in the comparative example, the number of pairs of each of the series arm resonators S2 to S4 is fewer than the number of pairs of the series arm resonator S1.

In addition to the reduction or prevention of the degradation of insertion loss in the passband of the filter 10b, it also becomes possible to reduce or prevent the degradation of insertion loss in the passband of the filter 10a by increasing the number of pairs of each of the series arm resonators S2 to S4 of the filter 10a.

Figure 8:
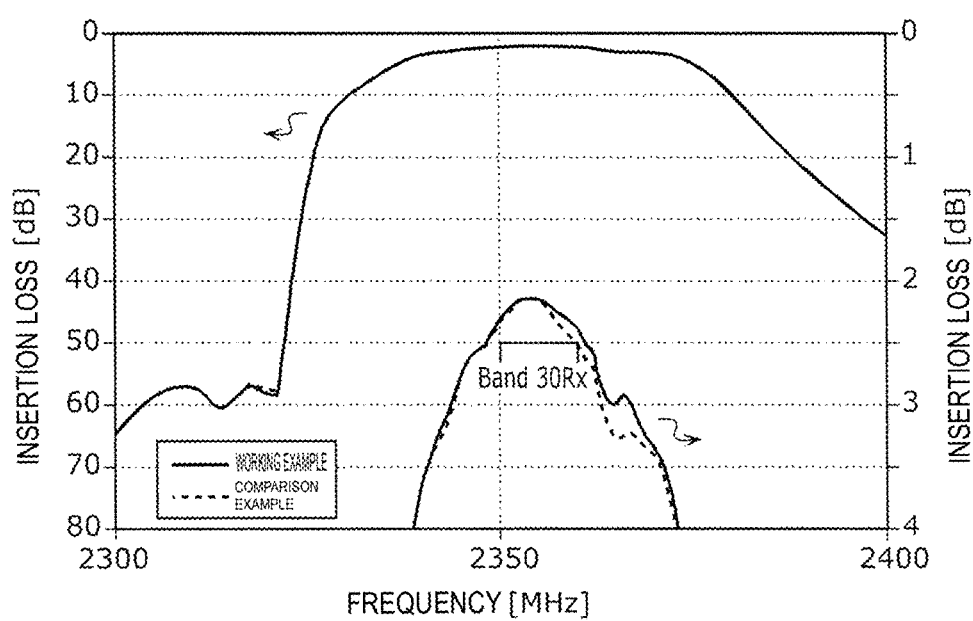
FIG. 8 is a graph that compares bandpass characteristics of the first filters according to the working example and the comparative example.

FIG. 8 is a graph that compares bandpass characteristics of the filters 10a (first filters) according to the working example and the comparative example. In FIG. 8, the horizontal axis represents the frequency, and the vertical axis represents the insertion loss of the filter 10a.

As illustrated in FIG. 8, it is discovered that in the passband of the filter 10a (that is, Band 30 Rx), the insertion loss in the passband is improved in the working example compared with the comparative example. Specifically, the insertion loss in the passband of the comparative example is about 2.50 dB at a maximum, whereas the insertion loss in the passband of the working example is about 2.37 dB at a maximum. This is because, in the working example, the number of pairs of each of the series arm resonators S2 to S4 in the filter 10a are larger, that is, the electrode finger resistance of the IDT electrode is smaller compared with the comparative example.

As described above, the degradation of insertion loss in the passband of both the filters 10a and 10b can be reduced or prevented by making the number of pairs of the series arm resonator S1, which is connected closest to the common terminal 20, the fewest among the numbers of pairs of the series arm resonators S1 to S4 and by making the numbers of pairs of the series arm resonators S2 to S4, not including the series arm resonator S1, larger.

Note that in the preferred embodiment 1, the filter 10a includes at least three (here, four) series arm resonators. In the case where the number of pairs of the series arm resonator S1 is reduced, the degradation of insertion loss in the passband of the filter 10b can be reduced or prevented. However, the total electrode finger resistance of the filter 10a increases by the amount corresponding to the reduced number of pairs of the series arm resonator S1, and this causes degradation of insertion loss in the passband of the filter 10a. Therefore, the total electrode finger resistance of the filter 10a can be made smaller by increasing the number of series arm resonators of the filter 10a and by increasing the numbers of pairs of the series arm resonators other than the series arm resonator S1, and therefore the degradation of insertion loss in the passband of the filter 10a can be reduced or prevented. Note that as described above, even when the numbers of pairs of the other series arm resonators are increased, these series arm resonators are spaced away from the common terminal 20. Therefore, increasing the numbers of pairs of the other series arm resonators is less likely to cause the degradation of insertion loss in the passband of the filter 10b.

Further, it is preferable that the numbers of pairs of the series arm resonators S1 to S4 are different from each other. For example, in the case where the number of pairs of the series arm resonator S1 is the fewest and the numbers of pairs of the series arm resonators S2 to S4 are the same as each other, Rayleigh wave ripples generated in the series arm resonators S2 to S4 are focused at one frequency. Therefore, even though the series arm resonators S2 to S4 are less likely to affect the return loss of the filter 10a, if Rayleigh wave ripples are generated and focused at one frequency, the return loss of the filter 10a increases in some cases. Therefore, in the working example, the numbers of pairs of the series arm resonators S1 to S4 are different from each other.

Further, for example, it is preferable that the number of pairs of the series arm resonator S1 is designed such that the return loss difference of the filter 10a is equal to or less than about 0.5 dB, for example. By setting the return loss difference to equal to or less than about 0.5 dB, the degradation of insertion loss in the passband of the filter 10b can be limited to about 0.15 dB or less. The degradation of insertion loss equal to or less than about 0.15 dB is smaller than the degradation of insertion loss generated due to processing variations of filter and is acceptable degradation. From FIG. 7, it was discovered that when the return loss difference of the filter 10a is equal to or less than about 0.5 dB, the number of pairs of the series arm resonator S1 is about 100 pairs or less. That is to say, it is preferable that the number of pairs of the series arm resonator S1 is designed to be about 100 pairs or less. This can reduce or prevent the degradation of insertion loss in the passband of the filter 10b more efficiently.

Further, for example, the filter 10b includes, as with the filter 10a, a plurality of series arm resonators on a second path and at least one parallel arm resonator between a connection node provided on the second path and the ground, the connection node being provided on the side closer to the input/output terminal 21b than a second series arm resonator which is one of the plurality of series arm resonators connected closest to the common terminal 20. The filters 10c to 10f also preferably have a ladder structure, for example.

Table 3 illustrates the number of pairs of the series arm resonator connected closest to the common terminal 20 in each of the filters of the multiplexer 10 according to the preferred embodiment 1.

TABLE 3

| Filter | Number of Pairs of Series Arm Resonator Connected Closest to Common Terminal (Pairs) |
|---|---|
| 10a | 75 |
| 10b | 237 |
| 10c | 180 |
| 10d | 171 |
| 10e | 180 |
| 10f | 95 |

As illustrated in Table 3, the number of pairs of a plurality of electrode fingers of the IDT electrode of the series arm resonator S1 included in the filter 10a (the number of electrode finger pairs of the series arm resonator S1) is fewer than the number of pairs of a plurality of electrode fingers of the IDT electrode of the second series arm resonator connected closest to the common terminal 20 included in the filters 10b to 10f (the number of electrode finger pairs of the second series arm resonator).

As described above, it is preferable to use a larger number of pairs for resonators of the filter in order to reduce the total electrode finger resistance of the filter. In the multiplexer 10, the passband of the filter 10b overlaps a generation frequency of Rayleigh wave ripples in the filter 10a, and therefore it is necessary to reduce the number of pairs of the series arm resonator S1 of the filter 10a. However, the multiplexer 10 does not include the filter whose passband overlaps a generation frequency of Rayleigh wave ripples of any of the filters 10b to 10f. Accordingly, for the filters 10b to 10f, it is not necessary to reduce the number of pairs of the series arm resonator closest to the common terminal 20. Instead, it is preferable to increase the number of pairs of the series arm resonator to reduce the total electrode finger resistance of the filter.

Because of this, as illustrated in Table 3, the number of pairs of the series arm resonator connected closest to the common terminal 20 included in each of the filters 10b to 10f is designed to be larger, and this enables the reduction or prevention of degradation of insertion loss in the passband of each of the filters 10b to 10f.

6. Conclusion

As described above, the multiplexer 10 includes the filter 10a on the first path connecting the common terminal 20 and the input/output terminal 21a and the filter 10b on the second path connecting the common terminal 20 and the input/output terminal 21b, the filter 10b having the passband that overlaps the generation frequency of Rayleigh wave ripples in the filter 10a. The filter 10a includes a plurality of series arm resonators on the first path and the parallel arm resonator P1 between a connection node provided on the first path and the ground, the connection node being provided on the side closer to the input/output terminal 21a than the series arm resonator S1 which is one of the plurality of series arm resonators connected closest to the common terminal 20. The plurality of series arm resonators and the parallel arm resonator P1 utilize SH waves as the main mode. The number of electrode finger pairs of the series arm resonator S1 is the fewest among the numbers of electrode finger pairs of the plurality of series arm resonators.

The series arm resonator S1 connected closest to the common terminal 20 among the plurality of series arm resonators is connected closest to the common terminal 20 side in the filter 10a, and therefore the series arm resonator S1 is likely to affect the filter 10b that is connected in common to the common terminal 20 together with the filter 10a and has the passband overlapping that frequency. From the simulation results illustrated in FIG. 6 and FIG. 7, it was discovered that the return loss difference (difference between the maximum and the minimum of the return loss in the passband of the filter 10b) of the filter 10a becomes smaller as the number of pairs of the series arm resonator S1 decreases, and Rayleigh wave ripples are reduced or prevented. Accordingly, the degradation of insertion loss in the passband of the filter 10b caused by Rayleigh wave ripples of an acoustic wave resonator can be reduced or prevented by making the number of pairs of the series arm resonator S1 the fewest among the numbers of pairs of the plurality of series arm resonators.

Further, making the number of pairs of the series arm resonator S1 the fewest among the numbers of pairs of the plurality of series arm resonators means, in other words, using a larger number of pairs for the series arm resonators other than the series arm resonator S1. The total electrode finger resistance of the filter 10a increases by reducing the number of pairs of the series arm resonator S1. However, the increase of the electrode finger resistance can be reduced or prevented by increasing the numbers of pairs of the series arm resonators other than the series arm resonator S1. This can reduce or prevent the degradation of insertion loss in the passband of the filter 10a.

Further, for example, the respective IDT electrodes of the plurality of series arm resonators and the parallel arm resonator P1 may be provided on the piezoelectric substrate 50 including a piezoelectric layer. The piezoelectric substrate 50 may include the piezoelectric layer, on one of principal surfaces of which the IDT electrodes are provided, a high acoustic velocity support substrate in which the acoustic velocity of bulk waves propagating therein is higher than the acoustic velocity of acoustic waves propagating in the piezoelectric layer, and a low acoustic velocity film in which the acoustic velocity of bulk waves propagating therein is lower than the acoustic velocity of bulk waves propagating in the piezoelectric layer, the low acoustic velocity film being provided between the high acoustic velocity support substrate and the piezoelectric layer.

It becomes possible to substantially increase Q-factors in the resonant frequency and the anti-resonant frequency of each resonator by including the resonator with such a multilayer structure in the plurality of series arm resonators and the parallel arm resonator P1. That is to say, because a high Q-factor surface acoustic wave resonator can be provided, it becomes possible to provide a filter having a low insertion loss using the surface acoustic wave resonator. Rayleigh wave ripples in the filter including a resonator having such a multilayer structure can be larger. However, in preferred embodiments of the present invention, the number of pairs of the series arm resonator S1 is the fewest among the numbers of pairs of the plurality of series arm resonators. Therefore, it becomes possible to provide a filter having a small insertion loss while reducing or preventing Rayleigh wave ripples.

Further, for example, the filter 10a may include a plurality of parallel arm resonators including the parallel arm resonator P1, and the number of electrode finger pairs of the parallel arm resonator P1 of the plurality of parallel arm resonators may be the fewest among the numbers of electrode finger pairs of the plurality of parallel arm resonators.

Similarly, of the plurality of parallel arm resonators, the parallel arm resonator P1 connected closest to the common terminal 20 is likely to affect the filter 10b because the parallel arm resonator P1 is connected to the common terminal 20 side as is the case with the series arm resonator S1. Because of this, the degradation of insertion loss in the passband of the filter 10b caused by Rayleigh wave ripples of an acoustic wave resonator can be reduced or prevented more efficiently by making the number of pairs of the parallel arm resonator P1 the fewest among the numbers of pairs of the plurality of parallel arm resonators.

Further, for example, the filter 10b may include a plurality of series arm resonators on the second path and at least one parallel arm resonator between a connection node provided on the second path and the ground, the connection node being provided on the side closer to the input/output terminal 21b than the second series arm resonator which is one of the plurality of series arm resonators connected closest to the common terminal 20. The number of electrode finger pairs of the series arm resonator S1 may be fewer than the number of electrode finger pairs of the second series arm resonator.

Reducing the number of pairs of the series arm resonator S1 to less than the number of pairs of the second series arm resonator that is included in the filter 10b and connected closest to the common terminal 20 means, in other words, using a larger number of pairs for the second series arm resonator in the filter 10b. The total electrode finger resistance of the filter 10b can be made smaller by increasing the number of pairs of the second series arm resonator of the filter 10b, and therefore the degradation of insertion loss in the passband of the filter 10b can be reduced or prevented more efficiently.

Further, for example, the number of electrode finger pairs of the series arm resonator S1 may preferably be equal to or less than about 100 pairs.

The degradation of insertion loss in the passband of the filter 10b caused by Rayleigh wave ripples of an acoustic wave resonator can be reduced or prevented more efficiently by specifically setting the number of pairs of the series arm resonator S1 to about 100 pairs or less.

Further, for example, the plurality of series arm resonators in the filter 10a may include at least three series arm resonators.

In the case where the number of pairs of the series arm resonator S1 is reduced, the degradation of insertion loss in the passband of the filter 10b can be reduced or prevented. However, the total electrode finger resistance of the filter 10a increases by the amount corresponding to the number of pairs of the series arm resonator S1 that has been reduced, and this causes degradation of insertion loss in the passband of the filter 10a. Therefore, the total electrode finger resistance of the filter 10a can be made smaller by increasing the number of series arm resonators of the filter 10a and by increasing the numbers of pairs of the series arm resonators other than the series arm resonator S1, and therefore the degradation of insertion loss in the passband of the filter 10a can be reduced or prevented more efficiently.

Further, for example, the numbers of electrode finger pairs of the at least three series arm resonators may be different from each other.

For example, in the case where the numbers of pairs of the series arm resonators other than the series arm resonator S1 are the same to each other, Rayleigh wave ripples generated in the series arm resonators other than the series arm resonator S1 are focused at one frequency. Therefore, even in the case where the series arm resonators other than the series arm resonator S1 are resonators that are less likely to affect the filter 10b, if Rayleigh wave ripples are generated and focused at one frequency, the return loss of the filter 10a increases in some cases. Accordingly, it becomes possible to reduce or prevent the increase of the return loss of the filter 10a by making the numbers of pairs of the at least three series arm resonators different from each other, and the degradation of insertion loss in the passband of the filter 10b caused by Rayleigh wave ripples of an acoustic wave resonator can be reduced or prevented more efficiently.

Further, for example, the generation frequency of Rayleigh wave ripples in the filter 10a is a frequency of about 0.74 to about 0.78 times the passband of the filter 10a.

Preferred Embodiment 2

The multiplexer according to the preferred embodiment 1 is applicable to a radio frequency front-end circuit and a communication device including the radio frequency front-end circuit. In the present preferred embodiment, such a radio frequency front-end circuit and such a communication device are described.

Figure 9:
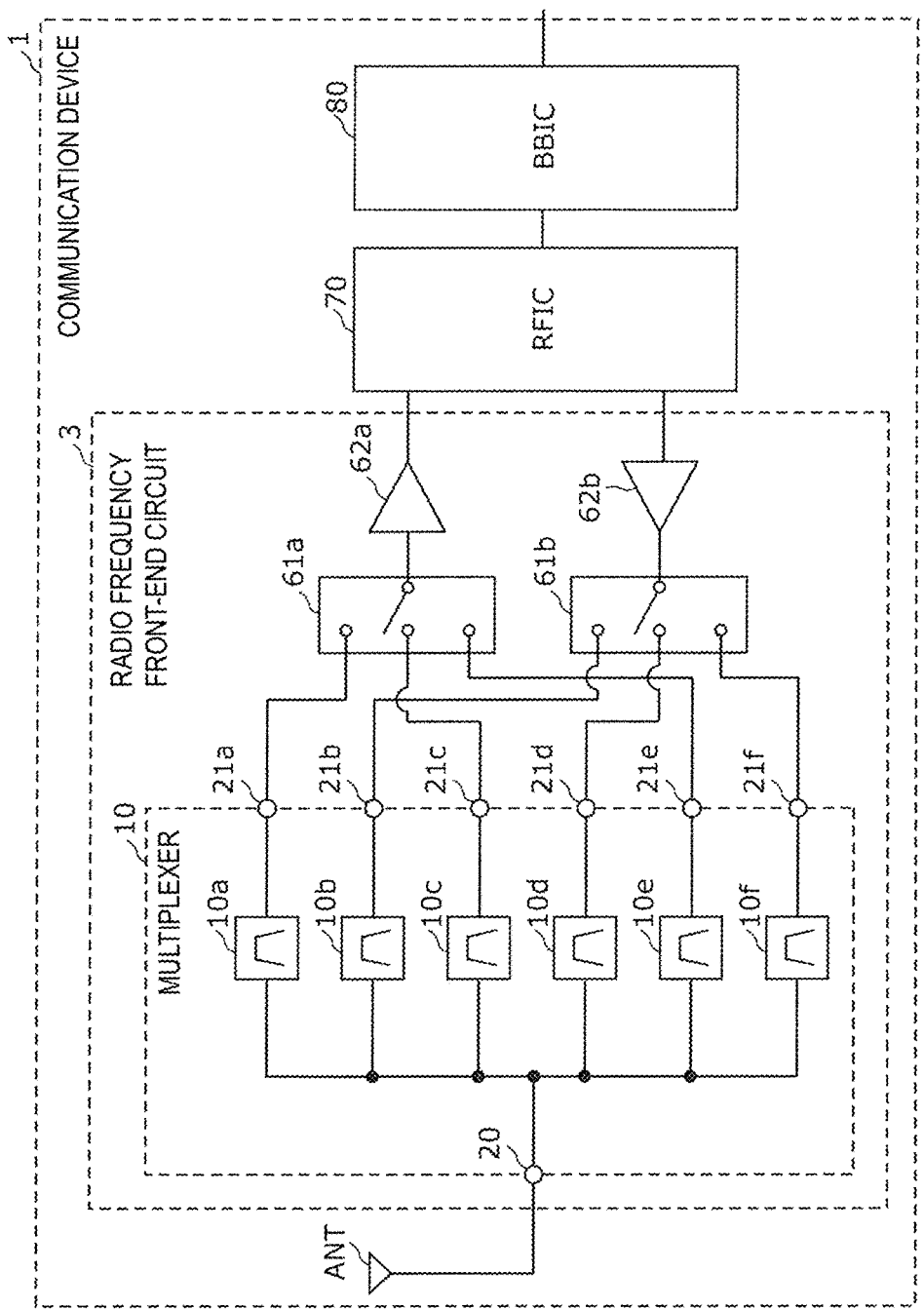
FIG. 9 is a circuit configuration diagram of a radio frequency front-end circuit and a communication device according to a preferred embodiment 2 of the present invention.

FIG. 9 is a circuit configuration diagram of a radio frequency front-end circuit 3 and a communication device 1 according to the preferred embodiment 2 of the present invention. An antenna element ANT, the radio frequency front-end circuit 3, a RF signal processing circuit 70, and a baseband signal processing circuit 80 define the communication device 1. Note that the antenna element ANT may be provided in a body separated from the communication device 1.

The radio frequency front-end circuit 3 includes a multiplexer 10 according to the preferred embodiment 1, switches 61a and 61b, a low noise amplifier circuit 62a, and a power amplifier circuit 62b.

The switch 61a is a switch circuit including a selection terminal connected to the input/output terminals 21a, 21c, and 21e of the multiplexer 10 and a common terminal connected to the low noise amplifier circuit 62a. The switch 61b is a switch circuit including a selection terminal connected to the input/output terminals 21b, 21d, and 21f of the multiplexer 10 and a common terminal connected to the power amplifier circuit 62b.

The switches 61a and 61b are each preferably defined by, for example, a single pole double throw (SPDT) switch that connects the common terminal and one of signal paths in the multiplexer 10 in response to a control signal from a controller (not illustrated). Note that the number of the selection terminals to be connected to the common terminal does not need to be one, and a plurality of such selection terminals may be included. That is to say, the radio frequency front-end circuit 3 may be compatible with carrier aggregation.

The low noise amplifier circuit 62a is a reception amplifier circuit that amplifies a radio frequency signal (here, a received radio frequency signal) that has been sent from the antenna element ANT to the multiplexer 10 to the switch 61a and outputs to the RF signal processing circuit 70. The power amplifier circuit 62b is a transmission amplifier circuit that amplifies a radio frequency signal (here, a transmitting radio frequency signal) input from the RF signal processing circuit 70 and outputs to the antenna element ANT via the switch 61b and the multiplexer 10.

The RF signal processing circuit 70 performs signal processing on the received radio frequency signal input from the antenna element ANT via a received signal path using down-converting and the like, for example, and outputs a received signal generated by this signal processing to the baseband signal processing circuit 80. Further, the RF signal processing circuit 70 performs signal processing on a transmitting signal input from the baseband signal processing circuit 80 using up-converting and the like, for example, and outputs a radio frequency signal generated by this signal processing to the radio frequency front-end circuit 3. The RF signal processing circuit 70 is preferably, for example, a RFIC.

Signals processed in the baseband signal processing circuit 80 are used, for example, as image signals for image display or as sound signals for calls.

Note that the radio frequency front-end circuit 3 may include other circuit elements in between the elements described above.

Further, depending on the processing system of radio frequency signals, the communication device 1 may not need to include the baseband signal processing circuit 80.

As described above, the radio frequency front-end circuit 3 according to a preferred embodiment of the present invention includes the multiplexer 10 and the amplifier circuit connected to the multiplexer 10.

This can provide the radio frequency front-end circuit capable of reducing or preventing the degradation of insertion loss in the passband caused by Rayleigh wave ripples of an acoustic wave resonator.

Further, the communication device 1 according to a preferred embodiment of the present invention includes the RF signal processing circuit 70 that processes radio frequency signals received or to be transmitted by the antenna element ANT and the radio frequency front-end circuit 3 that sends radio frequency signals between the antenna element ANT and the RF signal processing circuit 70.

This can provide the communication device capable of reducing or preventing the degradation of insertion loss in a passband caused by Rayleigh wave ripples of an acoustic wave resonator.

In the foregoing, the multiplexer, the radio frequency front-end circuit, and the communication device according to preferred embodiments of the present invention are described. However, the present invention may also include other preferred embodiments obtained by combining arbitrary elements of the foregoing preferred embodiments, modified examples obtained by applying various modifications apparent to those skilled in the art to the foregoing preferred embodiments without departing the scope of the present invention, and various devices including the radio frequency front-end circuits and the communication device according to the present invention.

For example, in the foregoing preferred embodiments, the hexaplexer is used as an example of the multiplexer 10. However, the present invention is also applicable to, for example, a multiplexer in which antenna terminals of two or more filters are connected in common.

Further, for example, in the foregoing preferred embodiments, the filter 10a includes four series arm resonators S1 to S4 as a plurality of series arm resonators. Alternatively, the filter 10a may include two, three, five, or more series arm resonators.

Further, for example, in the foregoing preferred embodiments, the filter 10a includes three parallel arm resonators P1 to P3. Alternatively, the filter 10a may include only one parallel arm resonator P1 or two, four, or more parallel arm resonators including the parallel arm resonator P1.

Further, for example, in the foregoing preferred embodiments, the filter 10a includes a plurality of series arm resonators and a plurality of parallel arm resonators. Alternatively, the filter 10a may further include a vertically coupled resonator in addition to the plurality of series arm resonators and the plurality of parallel arm resonators.

Further, for example, in the foregoing preferred embodiments, each resonator included in the filter 10a includes divided resonators. Alternatively, each resonator included in the filter 10a may not include divided resonators.

Further, for example, in the foregoing preferred embodiments, the filters 10b to 10f are acoustic wave resonators. Alternatively, the filters 10b to 10f may not need to be acoustic wave filters, and may be LC filters or the like, for example.

Further, the filters 10b to 10f may be provided in the same chip. In the case where the piezoelectric substrate 50 includes the piezoelectric layer, on one of principal surfaces on which the IDT electrode is provided, a high acoustic velocity support substrate in which the acoustic velocity of bulk waves propagating therein is higher than the acoustic velocity of acoustic waves propagating in the piezoelectric layer, and a low acoustic velocity film in which the acoustic velocity of bulk waves propagating therein is lower than the acoustic velocity of acoustic waves propagating in the piezoelectric layer, the low acoustic velocity film being disposed between the high acoustic velocity support substrate and the piezoelectric layer, even when the frequencies of the passbands of the filters 10b to 10f are separated, a desired passband can be obtained only by adjusting the pitch of the IDT electrode.

Preferred embodiments of the present invention can be widely used, for example, in communication equipment such as cellular phones and the like as a multiplexer, a front-end circuit, and a communication device, which are applicable to multiband systems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a first filter on a first path connecting a common terminal and a first terminal; and
   a second filter on a second path connecting the common terminal and a second terminal, the second filter having a passband that overlaps a generation frequency of a Rayleigh wave ripple in the first filter; wherein
   the first filter includes:
   a plurality of series arm resonators on the first path; and
   a first parallel arm resonator between a connection node provided on the first path and ground, the connection node being provided on a side closer to the first terminal than a first series arm resonator, the first series arm resonator being one of the plurality of series arm resonators connected closest to the common terminal;
   the plurality of series arm resonators and the first parallel arm resonator utilize an SH wave as a main mode; and
   a number of electrode finger pairs of the first series arm resonator is fewest among numbers of electrode finger pairs of the plurality of series arm resonators.

2. The multiplexer according to claim 1, wherein
   an IDT electrode of each of the plurality of series arm resonators and the first parallel arm resonator is provided on a substrate including a piezoelectric layer; and
   the substrate includes:
   a piezoelectric layer including principal surfaces, the IDT electrode being provided on one of the principal surfaces;
   a high acoustic velocity support substrate in which an acoustic velocity of a bulk wave propagating therein is higher than an acoustic velocity of an acoustic wave propagating in the piezoelectric layer; and
   a low acoustic velocity film in which an acoustic velocity of a bulk wave propagating therein is lower than the acoustic velocity of a bulk wave propagating in the piezoelectric layer, the low acoustic velocity film being disposed between the high acoustic velocity support substrate and the piezoelectric layer.

3. The multiplexer according to claim 1, wherein
   the first filter includes a plurality of parallel arm resonators including the first parallel arm resonator; and
   of the plurality of parallel arm resonators, a number of electrode finger pairs of the first parallel arm resonator is fewest among numbers of electrode finger pairs of the plurality of parallel arm resonators.

4. The multiplexer according to claim 1, wherein
   the second filter includes:
   a plurality of series arm resonators on the second path; and
   at least one parallel arm resonator between a connection node provided on the second path and the ground, the connection node being provided on a side closer to the second terminal than a second series arm resonator, the second series arm resonator being one of the plurality of series arm resonators connected closest to the common terminal; and
   the number of electrode finger pairs of the first series arm resonator is fewer than number of electrode finger pairs of the second series arm resonator.

5. The multiplexer according to claim 1, wherein the number of electrode finger pairs of the first series arm resonator is equal to or less than about 100 pairs.

6. The multiplexer according to claim 1, wherein the plurality of series arm resonators in the first filter include at least three series arm resonators.

7. The multiplexer according to claim 6, wherein numbers of electrode finger pairs of the at least three series arm resonators are different from one another.

8. The multiplexer according to claim 1, wherein the generation frequency of the Rayleigh wave ripple in the first filter is a frequency of about 0.74 to about 0.78 times a passband of the first filter.

9. A radio frequency front-end circuit comprising:
the multiplexer according to claim 1; and
an amplifier circuit connected to the multiplexer.

10. A communication device comprising:
a RF signal processing circuit that processes a radio frequency signal received by or to be transmitted from an antenna element; and
the radio frequency front-end circuit according to claim 9, the radio frequency front-end circuit sending a radio frequency signal between the antenna element and the RF signal processing circuit.

11. A multiplexer comprising:
a first filter on a first path connecting a common terminal and a first terminal; and
a second filter on a second path connecting the common terminal and a second terminal, the second filter having a passband that overlaps a generation frequency of a Rayleigh wave ripple in the first filter; wherein
the first filter includes a plurality of resonators, an IDT electrode provided on a piezoelectric substrate made of LiTaO₃ and having a cut angle in the cut angle range of about 35° to about 48°;
the plurality of resonators include:
  a plurality of series arm resonators on the first path; and
  a first parallel arm resonator between a connection node provided on the first path and ground, the connection node being provided on a side closer to the first terminal than a first series arm resonator, the first series arm resonator being one of the plurality of series arm resonators connected closest to the common terminal; and
a number of electrode finger pairs of the first series arm resonator is fewest among numbers of electrode finger pairs of the plurality of series arm resonators.

12. The multiplexer according to claim 11, wherein
the first filter includes a plurality of parallel arm resonators including the first parallel arm resonator; and
of the plurality of parallel arm resonators, a number of electrode finger pairs of the first parallel arm resonator is fewest among numbers of electrode finger pairs of the plurality of parallel arm resonators.

13. The multiplexer according to claim 11, wherein
the second filter includes:
  a plurality of series arm resonators on the second path; and
  at least one parallel arm resonator between a connection node provided on the second path and the ground, the connection node being provided on a side closer to the second terminal than a second series arm resonator, the second series arm resonator being one of the plurality of series arm resonators connected closest to the common terminal; and
the number of electrode finger pairs of the first series arm resonator is fewer than number of electrode finger pairs of the second series arm resonator.

14. The multiplexer according to claim 11, wherein the number of electrode finger pairs of the first series arm resonator is equal to or less than about 100 pairs.

15. The multiplexer according to claim 11, wherein the plurality of series arm resonators in the first filter include at least three series arm resonators.

16. The multiplexer according to claim 15, wherein numbers of electrode finger pairs of the at least three series arm resonators are different from one another.

17. The multiplexer according to claim 11, wherein the generation frequency of the Rayleigh wave ripple in the first filter is a frequency of about 0.74 to about 0.78 times a passband of the first filter.

18. A radio frequency front-end circuit comprising:
the multiplexer according to claim 11; and
an amplifier circuit connected to the multiplexer.

19. A communication device comprising:
a RF signal processing circuit that processes a radio frequency signal received by or to be transmitted from an antenna element; and
the radio frequency front-end circuit according to claim 18, the radio frequency front-end circuit sending a radio frequency signal between the antenna element and the RF signal processing circuit.

20. A multiplexer comprising:
a first filter on a first path connecting a common terminal and a first terminal; and
a second filter on a second path connecting the common terminal and a second terminal, the second filter having a passband that overlaps a generation frequency of a Rayleigh wave ripple in the first filter; wherein
the first filter includes a plurality of resonators, an IDT electrode provided on a substrate including a piezoelectric layer made of LiTaO₃ and having a cut angle in the cut angle range of about −30° to about 90°;
the substrate includes:
  a piezoelectric layer including principal surfaces, the IDT electrode being provided on one of the principal surfaces;
  a high acoustic velocity support substrate in which an acoustic velocity of a bulk wave propagating therein is higher than an acoustic velocity of an acoustic wave propagating in the piezoelectric layer; and
  a low acoustic velocity film in which an acoustic velocity of a bulk wave propagating therein is lower than the acoustic velocity of a bulk wave propagating in the piezoelectric layer, the low acoustic velocity film being disposed between the high acoustic velocity support substrate and the piezoelectric layer;
the plurality of resonators include:
  a plurality of series arm resonators on the first path; and
  a first parallel arm resonator between a connection node provided on the first path and ground, the connection node being provided on a side closer to the first terminal than a first series arm resonator, the first series arm resonator being one of the plurality of series arm resonators connected closest to the common terminal; and
a number of electrode finger pairs of the first series arm resonator is fewest among numbers of electrode finger pairs of the plurality of series arm resonators.

* * * * *